(12) United States Patent
Zhang et al.

(10) Patent No.: US 10,888,958 B2
(45) Date of Patent: Jan. 12, 2021

(54) HYBRID HIGH TEMPERATURE LEAD-FREE SOLDER PREFORM

(71) Applicant: Indium Corporation, Utica, NY (US)

(72) Inventors: Hongwen Zhang, Utica, NY (US); Joseph Wu, Utica, NY (US); Jonathan Minter, Utica, NY (US); Ning-Cheng Lee, Utica, NY (US)

(73) Assignee: INDIUM CORPORATION, Utica, NY (US)

( * ) Notice: Subject to any disclaimer, the term of this patent is extended or adjusted under 35 U.S.C. 154(b) by 226 days.

(21) Appl. No.: 15/992,102

(22) Filed: May 29, 2018

(65) Prior Publication Data

US 2019/0366486 A1 Dec. 5, 2019

(51) Int. Cl.
*B23K 35/02* (2006.01)
*B23K 35/26* (2006.01)
*C22C 12/00* (2006.01)
*H01L 23/00* (2006.01)
*H05K 3/34* (2006.01)

(52) U.S. Cl.
CPC ........ *B23K 35/0244* (2013.01); *B23K 35/262* (2013.01); *B23K 35/264* (2013.01); *C22C 12/00* (2013.01); *H01L 24/83* (2013.01); *H05K 3/3457* (2013.01)

(58) Field of Classification Search
None
See application file for complete search history.

(56) References Cited

U.S. PATENT DOCUMENTS

| | | | |
|---|---|---|---|
| 5,881,944 A | 3/1999 | Edwards et al. | |
| 5,957,364 A * | 9/1999 | Socha | B23K 35/0222 228/214 |
| 6,186,390 B1 * | 2/2001 | Tadauchi | B23K 35/0227 228/56.3 |
| 8,070,048 B2 * | 12/2011 | Oh | B23K 1/0016 228/178 |
| 8,348,139 B2 * | 1/2013 | Liu | B23K 35/0238 228/246 |

(Continued)

OTHER PUBLICATIONS

International Search Report and Written Opinion dated Sep. 3, 2019 in International Application No. PCT/US2019/033251, filed May 21, 2019.

*Primary Examiner* — Devang R Patel
(74) *Attorney, Agent, or Firm* — Sheppard, Mullin, Richter & Hampton LLP

(57) ABSTRACT

A lead-free solder preform includes a core layer and adhesion layer coated over surfaces of the core layer, where the preform delivers the combined merits from constituent solder alloys of the core and adhesion layers to provide both high temperature performance and improved wetting in high-temperature solder applications such as die attach. The core layer may be formed of a Bi Alloy having a solidus temperature above 260° C., and the adhesion layer may be formed of Sn, a Sn alloy, a Bi alloy, In, or an In alloy having a solidus temperature below 245° C. The solder preform may be formed using techniques such as: (1) electroplating a core ribbon with an adhesion material, (2) cladding an adhesion material foil onto a core ribbon, and/or (3) dipping a core ribbon in a molten adhesion alloy bath to allow thin layers of adhesion material to adhere to a core ribbon.

19 Claims, 10 Drawing Sheets

(56) References Cited

U.S. PATENT DOCUMENTS

| | | | |
|---|---|---|---|
| 2003/0019661 A1* | 1/2003 | Aoyama | H01B 1/026 174/126.1 |
| 2011/0268985 A1 | 11/2011 | Zhang et al. | |
| 2014/0124925 A1* | 5/2014 | Sidhu | B23K 35/262 257/738 |
| 2015/0246417 A1 | 9/2015 | Zhang et al. | |
| 2016/0244891 A1* | 8/2016 | Son | C25D 5/10 |

* cited by examiner

HYBRID HIGH TEMPERATURE LEAD-FREE SOLDER PREFORM

TECHNICAL FIELD

The present disclosure relates generally to solder preforms, and more particularly, some implementations relate to solder preforms for high temperature solder joint applications.

DESCRIPTION OF THE RELATED ART

Lead (Pb) generated by the disposal of electronic assemblies is considered hazardous to the environment and human health. Regulations increasingly prohibit the use of Pb-based solders in the electronic interconnection and electronic packaging industries. Pb-free solders replacing traditional eutectic Pb—Sn solders have been widely investigated. SnAg, SnCu, and SnAgCu based solders have become popular solders for forming interconnections in the semiconductor and electronics industries. However, the development of high melting temperature Pb-free solders to replace the conventional high lead ones (i.e., Pb-5Sn & Pb-5Sn-2.5Ag) is still in its infancy.

A common use of high melting temperature solders is for die-attach applications. During die attachment, a die containing an integrated circuit is bonded to a substrate, package, or another die in the formation of electronic devices/components. In such applications, the electronic devices/components made after die attachment are used in subsequent surface mounting processes. For example, a silicon die may be soldered onto a lead-frame using a high melting temperature solder to form an assembly. Subsequently, a silicon die/lead-frame assembly (either encapsulated or not), is attached onto a printed wiring board (PWB) by soldering or mechanical fastening. During manufacture, the board may be exposed to a few more reflow soldering processes to bond other surface mounted components onto the same board. During these further soldering processes, the internal connection between the silicon die and the lead-frame should be well maintained. This requires that the high melting temperature solder resist multiple reflow soldering processes without any functional failures. Accordingly, in order to be compatible with solder reflow profiles used in the industry, the major requirements for high temperature solders include: (i) a melting temperature around 260° C. and above (in accordance with typical solder reflow profiles), (ii) good thermal fatigue resistance, (iii) the high thermal/electric conductivity, and (iv) low cost.

Current lead-free drop-in alternatives available in the industries are limited. One proposed alternative includes Bi—Ag alloys having a solidus temperature of 262° C., which satisfies the melting temperature requirement for high temperature die-attach solders. However, Bi—Ag does not offer good wetting on commonly-used surface finish materials because of a poor reaction chemistry between Bi and the surface finish materials. This results in a weak bonding interface originating from the poor wetting. Thus, Bi—Ag alloys, alone, cannot properly be used as a solder material for bonding.

Some attempts have been made to modify the reaction chemistry between Bi—Ag and the surface finish by alloying Sn into BiAg. Sn has good reaction chemistry with commonly-used surface finish materials such as Cu, Ag, Ni, Au etc. However, directly alloying Sn into Bi—Ag may cause a significant decrease in the melting temperature (if too much Sn is alloyed) or the formation of Ag3Sn intermetallic compound (IMC) phases in the alloy. For example, if too much Sn is alloyed, the excessive Sn forms low melting Bi—Sn phases in the Bi matrix, which will make a solder joint formed from such a solder unsuitable for high temperature soldering. On the other hand, the formation of Ag3Sn IMC phases in the alloy may not allow for the improved reaction chemistry between Sn and substrate metals. During reflow soldering, Ag3Sn takes time to dissolve back to the molten Bi matrix to release the free Sn. These free Sn diffuse to the interface and react with surface finish materials to provide wetting. In most cases, however, the dewetting of the molten Bi matrix occurs before the free Sn are released. After dewetting, the solder retreats. The Bi matrix does not return to the area it retreated from even after the free Sn is released. As such, alloying Sn directly into Bi—Ag alloys reveals minimal improvements.

U.S. Pat. No. 9,017,446, assigned to Indium, describes a mixed alloy solder paste composed of two different solder powders and a flux that addresses these issues. A first, high melting temperature solder powder provides good mechanical performance and thermal/electrical behavior of the final solder joint. The second solder powder, which melts before the first solder powder, controls wetting on various common bonding surface finishes and interfacial IMC formation without compromising the high melting temperature of the final joint.

There are presently no high temperature lead-free solder preforms, extruded/rolled/punched from a single alloy segment, that offer both i) good high melting temperature performance (e.g., at 260° C. and above), ii) improved wetting performance for applications such as die attach, and iii) low cost.

BRIEF SUMMARY OF EMBODIMENTS

The disclosure describes a lead-free solder preform including a core layer and adhesion layer coated over surfaces of the core layer, where the preform delivers the combined merits from constituent solder alloys of the core and adhesion layers to provide both high temperature performance and improved wetting in high-temperature solder applications such as die attach.

In one embodiment, a solder preform includes: a core layer including a first solder alloy having a solidus temperature above 260° C., where the first solder alloy is a Bi alloy; and an adhesion layer coated over the core layer, the adhesion layer including a second solder alloy or metal having a solidus temperature below 245° C., where the second solder alloy or metal is Sn, a Sn alloy, a Bi alloy, In, or an In alloy.

In implementations, the adhesion layer has a designed thickness such that there is enough wetting during soldering and no low melting phases inside a solder joint after soldering reflow.

In implementations, the core layer may have a thickness between about 1 and 8 mils. In implementations where the adhesion layer is composed of the metal Sn, the adhesion layer may have a minimum thickness between about 0.1 and 7 microns. In implementations where the adhesion layer is composed of Bi—Sn, the adhesion layer may have a minimum thickness between about 0.1 and 52 microns.

In implementations, the second solder alloy may be a Sn—Ag alloy, a Sn—Cu alloy, a Sn—Ag—Cu alloy, a Sn—Ag—Cu—X (X=Al, Au, Bi, Co, Ga, Ge, In, Mn, Ni, P, Pd, Pt, Sb, or Zn) alloy, a Sn—Zn alloy, a Sn—In alloy or a Sn—In—X (X=Ag, Al, Au, Bi, Co, Cu, Ga, Ge, Mn, Ni, P, Pd, Pt, Sb, or Zn) alloy.

In particular implementations, the second solder alloy may be a Bi—Sn alloy, a Bi—Sn—X (X=Ag, Al, Au, Co, Cu, Ga, Ge, In, Mn, Ni, P, Pd, Pt, Sb, or Zn) alloy, a Bi—In alloy, or a Bi—In—X (X=Ag, Al, Au, Co, Cu, Ga, Ge, Mn, Ni, P, Pd, Pt, Sb, or Zn) alloy.

In implementations, the first solder alloy may be a Bi—Ag alloy, a Bi—Cu alloy, a Bi—Ag—Cu alloy, or a Bi—Sb alloy.

In one embodiment, a method of making a solder preform, includes: forming a core layer of a first solder alloy, the first solder alloy having a solidus temperature above 260° C., where the first solder alloy is a Bi alloy; and adding an adhesion layer onto surfaces of the formed core layer, the adhesion layer including a second solder alloy or metal having a solidus temperature below 245° C., where the second solder alloy or metal is Sn, a Sn alloy, a Bi alloy, In, or an In alloy.

In implementations, forming the core layer includes forming a solder ribbon of the first alloy, where adding an adhesion layer includes adding the second solder alloy or metal to surfaces of the ribbon, where the method further includes: after adding the adhesion layer, rolling the ribbon to a desired thickness; and punching or cutting a preform from the rolled ribbon.

In implementations, adding the adhesion layer to surfaces of the ribbon includes: electroplating the surface of the ribbon with an adhesion material made of the second solder alloy or metal.

In implementations, adding the adhesion layer to surfaces of the ribbon includes: cladding an adhesion material foil made of the second solder alloy or metal on top and bottom sides of the ribbon.

In implementations, adding the adhesion layer to surfaces of the ribbon includes: dipping the ribbon in a molten bath of the second solder alloy or metal.

In implementations, forming the solder ribbon of the first alloy includes: casting, extruding, and rolling into a ribbon the first solder alloy.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations. Furthermore, it should be noted that for clarity and ease of illustration, the elements in the figures have not necessarily been drawn to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The technology disclosed herein is directed to a lead-free solder preform including a core layer and adhesion layer(s) coated over surfaces of the core layer, where the preform delivers the combined merits from constituent solder alloys of the core and adhesion layers to provide both high temperature performance and improved wetting in high-temperature solder applications such as die attach. In accordance with implementations, performance benefits that may be achieved by using solder preforms described herein include: (1) formation of solder joints having a melting temperature of 260° C. and above; (2) good thermal fatigue performance; (3) good thermal and/or electrical conductivity and (4) a relatively low cost of application as compared with other Lead-free options.

In accordance with implementations, the core layer of the solder preform may be composed of a first alloy having a high melting temperature and exhibiting good mechanical properties and an acceptable thermal/electrical conductivity. The adhesion layer coating of the solder preform may be composed of a second alloy to provide superior reaction chemistry to wet on various common surface finishes of a substrate (e.g., Cu, Ag, Ni, Au).

Further implementations described herein are directed to methods of preparing the solder preforms described herein, and methods of joining electronic components and/or mechanical parts with the solder preforms. For example, the core-adhesion structure of the solder preforms described herein may be manufactured using techniques such as: (1) electroplating a core ribbon with an adhesion material, (2) cladding an adhesion material foil onto a core ribbon, and/or (3) dipping a core ribbon in a molten adhesion alloy bath to allow thin layers of adhesion material to adhere to a core ribbon.

Figure 1:
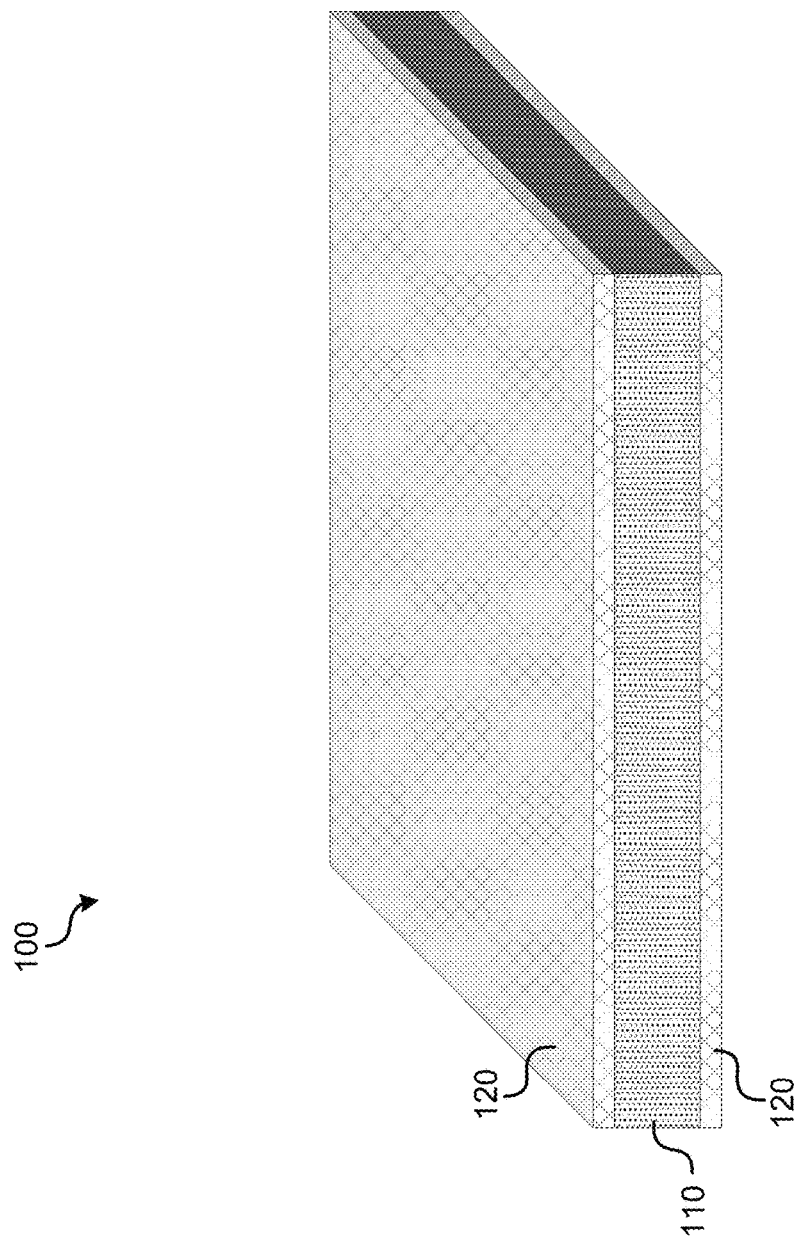
FIG. 1 illustrates a rectangular cross-section of a solder preform in accordance with implementations described herein.

FIG. 1 illustrates a rectangular cross-section of solder preform 100 in accordance with implementations. Although a plate-shaped solder preform having a rectangular cross-section is illustrated in this example, it should be noted that solder preform may comprise various other standard shapes such as discs, washers, frames, squares, pellets, or some other standard shape or non-standard shape (e.g., for special applications). As shown, preform 100 includes a core layer 110 and adhesion layer(s) 120 coated or otherwise formed over surfaces of the core layer 110 that contact a bonding substrate during soldering. For example, the core layer 110 may be formed from a ribbon of a first alloy, and the adhesion layers 120 may formed by dipping the ribbon in a bath of a second metal or alloy, electroplating the ribbon with the second alloy, or cladding a foil of the second alloy onto the ribbon. Although in this example, adhesion layers 120 are shown as being formed over top and bottom surfaces of core layer 110, it should be appreciated that in some implementations the preform may be formed such that adhesion layer(s) coat all or substantially all surfaces of the core layer.

In accordance with implementations, core layer 110 comprises an alloy having a high melting temperature (e.g., a solidus temperature of 260° C. or higher) and exhibiting good mechanical properties and an acceptable thermal/electrical conductivity. Adhesion layers 120 of the solder preform comprise a second metal or alloy having a lower melting temperature than the core layer alloy, and configured to provide superior reaction chemistry to wet on various common surface finishes of a substrate (e.g., Cu, Ag, Ni, Au). For example, the adhesion layer alloy on the outside of the preform may be selected to control the formation of an IMC along a bonding interface and enhance a bonding strength of the solder preform without harming the high temperature performance provided by the core layer alloy.

Figure 2:
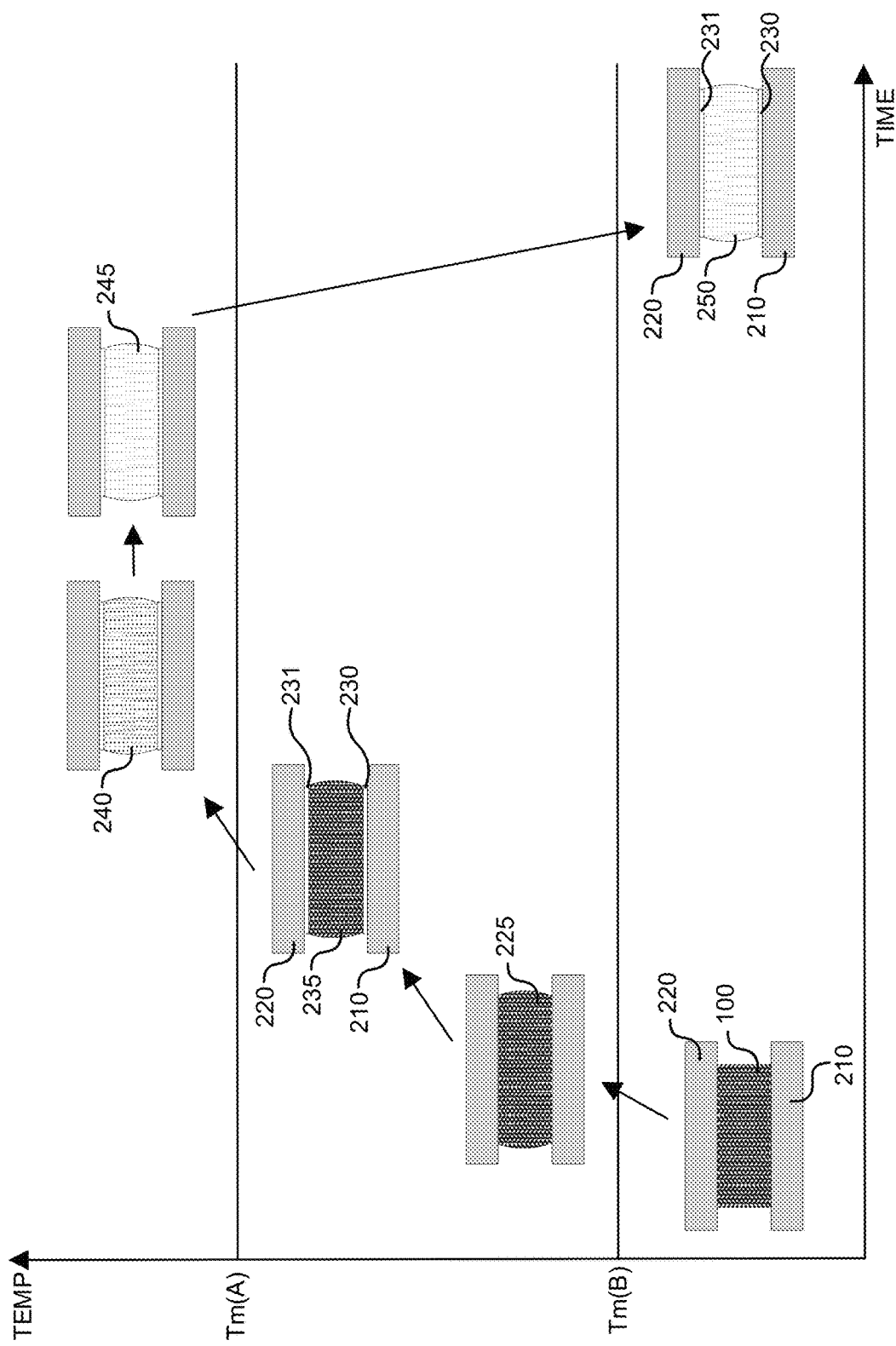
FIG. 2 illustrates a reflow solder process using a solder preform in accordance with implementations described herein.

By way of example, FIG. 2 illustrates a reflow solder process using solder preform 100 in accordance with implementations. As illustrated, solder perform 100 may be placed on a substrate (e.g., a Cu or Ni substrate) 210, and a device 220 such as a die may be placed on the solder preform to form an assembly. During reflow, the temperature of the assembly rises above the melting temperature Tm(B) of the metal or alloy of the adhesion layer. The metal or alloy of the adhesion layer coating the core layer melts 225 while the core layer alloy remains solid. The superior surface reaction chemistry of the alloy of the adhesion layer will facilitate the wetting of the core layer alloy on the substrate. This leads to the formation of an IMC layer 230 between the molten alloy of the adhesion layer and the substrate 210, and an IMC layer 231 between the molten alloy of the adhesion layer and device 220. Accordingly, the thickness of the IMC layer may be controlled by the thickness and/or quantity of alloy of the adhesion layer.

Additionally, the alloy of the adhesion layer may be designed to have a good affinity to the alloy of the core layer. This affinity may be determined by (1) the negative mixing enthalpy between the alloys, and/or (2) the formation of a eutectic phase composed of the constituent elements from the alloys. In some implementations, this affinity results in some of the core layer alloy dissolving into the molten adhesion layer alloy to form a mixture 235 of both.

As the temperature rises above the core alloy's melting temperature, Tm(A), the core alloy finishes melting, forming a molten solution 240 of the core layer and the remaining adhesion layer alloys, which wets the IMC layers 230-231. As the assembly is maintained above Tm(A), the adhesion layer alloy or the reactive elements from the adhesion layer may be depleted from the solution by continuously forming the interfacial IMC, and leaving the molten core layer alloy 245.

In some embodiments, in addition to forming the IMC layers, the excess constituents from the adhesion layer alloy may be incorporated into IMCs with constituents from the core layer alloy so that there is no low melting phases left inside the joint at all.

As the assembly is cooled, a solder bump or joint 250 is formed of the substrate 210 bonded to the IMC 230 and the device 220 bonded to the IMC 231, which is bonded to the solidified core layer alloy. After solidification, a homogenous solder joint with the improved bonding interface has been achieved.

For high temperature solder applications, the core layer alloy may be chosen from various high melting solder alloys. In some embodiments, Bi-rich alloys having a solidus temperature of about 260° C. and above, e.g., Bi—Ag, Bi—Cu, and Bi—Ag—Cu, may be used. The adhesion layer alloy may be chosen from alloys that have a lower melting temperature and have shown superior chemistry to wet on and adhere to various metallization surface finishes and good affinity to the molten Bi. In embodiments, the adhesion layer alloy may be chosen to have a solidus temperature of about 245° C. and below.

In embodiments, the adhesion layer alloy will melt before or together with the Bi-rich alloy of the core layer and then easily wet on and adhere to the substrate. In implementations, good affinity between Bi and the adhesion layer alloy may provide good wetting. Accordingly, in some embodiments, Sn, Sn-containing alloys, In, and In alloys may be chosen to be the metal or alloy of the adhesion layers.

In one implementation, the alloy of the preform's core has a solidus temperature of about 260° C. and above, and may comprise a Bi—Ag alloy or Bi—Ag—X (X=Al, Au, Co, Ga, Ge, In, Mn, Ni, P, Pd, Pt, Sb, Sn, or Zn) alloy. In some Bi—Ag implementations, the core alloy comprises 0 to 30 wt % Ag with the remainder being Bi. In particular Bi—Ag implementations, the core alloy comprises from 2.5 to 16 wt % Ag with the remainder being Bi. In some Bi—Ag—X implementations, the core alloy comprises from greater than 0 to 20 wt % Ag, from greater than 0 to 5 wt % X, with the remainder being Bi. In particular Bi—Ag—X implementations, the core alloy comprises from greater than 0 to 16 wt % Ag, from greater than 0 to 2 wt % X, with the remainder being Bi.

In one implementation, the alloy of the preform's core has a solidus temperature of about 270° C. and above, and may comprise a Bi—Cu alloy or Bi—Cu—X (X=Al, Au, Co, Ga, Ge, In, Mn, Ni, P, Pd, Pt, Sb, Sn, or Zn) alloy. In some Bi—Cu implementations, the core alloy comprises from greater than 0 to 5 wt % Cu, with the remainder being Bi. In particular Bi—Cu implementations, the core alloy comprises 0.2 to 1.5 wt % Cu with the remainder being Bi. In some Bi—Cu—X implementations, the core alloy comprises from greater than 0 to 5 wt % Cu, from greater than 0 to 5 wt % X, with the remainder being Bi. In particular Bi—Cu—X implementations, the core alloy comprises from greater than 0 to 5 wt % Cu, from greater than 0 to 2 wt % X, with the remainder being Bi.

In one implementation, the alloy of the preform's core has a solidus temperature of about 270° C. and above, and may comprise a Bi—Sb alloy or Bi—Sb—X (X=Ag, Al, Au, Co, Cu, Ga, Ge, In, Mn, Ni, P, Pd, Pt, Sb, Sn, or Zn) alloy. In some Bi—Sb implementations, the core alloy comprises from greater than 0 to 20 wt % Sb, with the remainder being Bi. In particular Bi—Sb implementations, the core alloy comprises from greater than 0 to 10 wt % Sb, with the remainder being Bi. In some Bi—Sb—X implementations, the core alloy comprises from greater than 0 to 20 wt % Sb, from greater than 0 to 10 wt % X, with the remainder being Bi. In particular Bi—Sb—X implementations, the core alloy comprises from greater than 0 to 10 wt % Sb, from greater than 0 to 5 wt % X, with the remainder being Bi.

In one implementation, the alloy of the preform's core has a solidus temperature of about 260° C. and above, and may comprise a Bi—Ag—Cu alloy or Bi—Ag—Cu—X (X=Al, Au, Co, Ga, Ge, In, Mn, Ni, P, Pd, Pt, Sb, Sn, or Zn) alloy. In some Bi—Ag—Cu implementations, the core alloy comprises from greater than 0 to 20 wt % Ag, from greater than 0 to 5 wt % Cu, with the remainder being Bi. In particular Bi—Ag—Cu implementations, the core alloy comprises 2.5 to 16 wt % Ag, 0.2 to 1.5 wt % Cu, with the remainder being Bi. In some Bi—Ag—Cu—X implementations, the core alloy comprises from greater than 0 to 20 wt % Ag, from greater than 0 to 5 wt % Cu, from greater than 0 to 5 wt % X, with the remainder being Bi. In particular Bi—Ag—Cu—X implementations, the core alloy comprises from greater than 0 to 16 wt % Ag, from greater than 0 to 1.5 wt % Cu, from greater than 0 to 2 wt % X, with the remainder being Bi.

In various implementations, the preform's adhesion layer may have a solidus temperature between about 100° C. and 250° C. It may be composed of Sn, a Sn alloy, In, or an In alloy.

In one implementation, the preform's adhesion layer is composed of the metal Sn or a SnSb alloy, and has a melting temperature between about 231° C. and 245° C.

In one implementation, the preform's adhesion layer comprises a Sn—Ag alloy, and has a melting temperature about 221° C. and above. In some implementations, the adhesion layer alloy comprises from greater than 0 to 10 wt % Ag, with the remainder being Sn. In a particular implementation, the adhesion layer alloy comprises from greater than 0 to 5 wt % Ag, with the remainder being Sn.

In one implementation, the preform's adhesion layer comprises an Sn—Cu alloy, and has a melting temperature about 227° C. and above. In some implementations, the adhesion layer alloy comprises from greater than 0 to 5 wt % Cu, with the remainder being Sn. In a particular implementation, the adhesion layer alloy comprises from greater than 0 to 2 wt % Cu, with the remainder being Sn.

In one implementation, the preform's adhesion layer comprises an Sn—Ag—Cu alloy, and has a melting temperature between about 217° C. and above. In some implementations, the adhesion layer alloy comprises from greater than 0 to 10 wt % Ag, from greater than 0 to 5 wt % Cu, with the remainder being Sn. In particular implementations, the adhesion layer alloy comprises from greater than 0 to 5 wt % Ag, from greater than 0 to 2 wt % Cu, with the remainder being Sn.

In one implementation, the preform's adhesion layer comprises an Sn—Ag—Cu—X alloy (X=Al, Au, Bi, Co, Ga, Ge, In, Mn, Ni, P, Pd, Pt, Sb, or Zn), and has a melting temperature between about 200° C. and above. In some implementations, the adhesion layer alloy comprises from greater than 0 to 10 wt % Ag, from greater than 0 to 5 wt % Cu, from greater than 0 to 5 wt % X, with the remainder being Sn. In particular implementations, the adhesion layer alloy comprises from greater than 0 to 5 wt % Ag, from greater than 0 to 2 wt % Cu, from greater than 0 to 2 wt % X, with the remainder being Sn.

In one implementation, the preform's adhesion layer comprises a Sn—Zn alloy, and has a melting temperature about 190° C. and above. In some implementations, the adhesion layer alloy comprises from greater than 0 to 20 wt % Zn with the remainder being Sn. In particular implementations, the adhesion layer alloy comprises from 1 to 11 wt % Zn, with the remainder being Sn.

In one implementation, the preform's adhesion layer comprises a Sn—Bi alloy or Bi—Sn—X (X=Ag, Al, Au, Co, Cu, Ga, Ge, In, Mn, Ni, P, Pd, Pt, Sb, or Zn) alloy, and has melting temperature about 100° C. and above. In some Sn—Bi implementations, the adhesion layer alloy comprises from 2 to 95 wt % Sn with the remainder being Bi. In particular Bi—Sn implementations, the adhesion layer alloy comprises from 2 to 42 wt % Sn with the remainder being Bi. In some Sn—Bi—X implementations, the adhesion layer alloy comprises from 2 to 50 wt % Sn, from greater than 0 to 30 wt % X, with the remainder being Bi. In particular Sn—Bi—X implementations, the adhesion layer alloy comprises from 2 to 42 wt % Sn, from greater than 0 to 5 wt % X, with the remainder being Bi.

In one implementation, the preform's adhesion layer comprises a Sn—In alloy or Sn—In—X (X=Ag, Al, Au, Bi, Co, Cu, Ga, Ge, Mn, Ni, P, Pd, Pt, Sb, or Zn) alloy, and has a melting temperature about 100° C. and above. In some Sn—In implementations, the adhesion layer alloy comprises from greater than 0 to 50 wt % In with the remainder being Sn. In particular Sn—In implementations, the adhesion layer alloy comprises from 1 to 40 wt % In with the remainder being Sn. In some Sn—In—X implementations, the adhesion alloy comprises from greater than 0 to 50 wt % In, from greater than 0 to 30 wt % X, with the remainder being Sn. In particular Sn—In—X implementations, the adhesion layer alloy comprises from 1 to 40 wt % In, from greater than 0 to 5 wt % X, with the remainder being Sn.

In one implementation, the preform's adhesion layer comprises a In—Bi alloy or In—Bi—X (X=Ag, Al, Au, Co, Cu, Ga, Ge, Mn, Ni, P, Pd, Pt, Sb, or Zn) alloy, and has a melting temperature about 100° C. and above. In some Bi—In implementations, the adhesion layer alloy comprises from greater than 0 to 50 wt % In with the remainder being Bi. In particular Bi—In implementations, the adhesion layer alloy comprises from 1 to 20 wt % In with the remainder being Bi. In some In—Bi—X implementations, the adhesion alloy comprises from greater than 0 to 50 wt % In, from greater than 0 to 30 wt % X, with the remainder being Bi. In particular In—Bi—X implementations, the adhesion layer alloy comprises from greater than 0 to 20 wt % In, from greater than 0 to 5 wt % X, with the remainder being Bi.

In various implementations, the thickness of the adhesion layer may be tuned to satisfy the following properties of the solder preform: (1) improved reaction chemistry and wetting behavior during bonding; (2) no excessive low melting phase of the formed solder joint; and (3) no harm to the preform's final geometric specifications. To meet the requirements, the design of the alloy compositions for both core layer and adhesion layer as well as the minimum thickness of the adhesion layer relative to the core layer have to follow a practical formula. For example, the minimum thickness of the adhesion layer may be controlled depending on the thickness of the core layer, the alloy composition of the core layer, and the composition of the adhesion layer itself.

Figure 9:
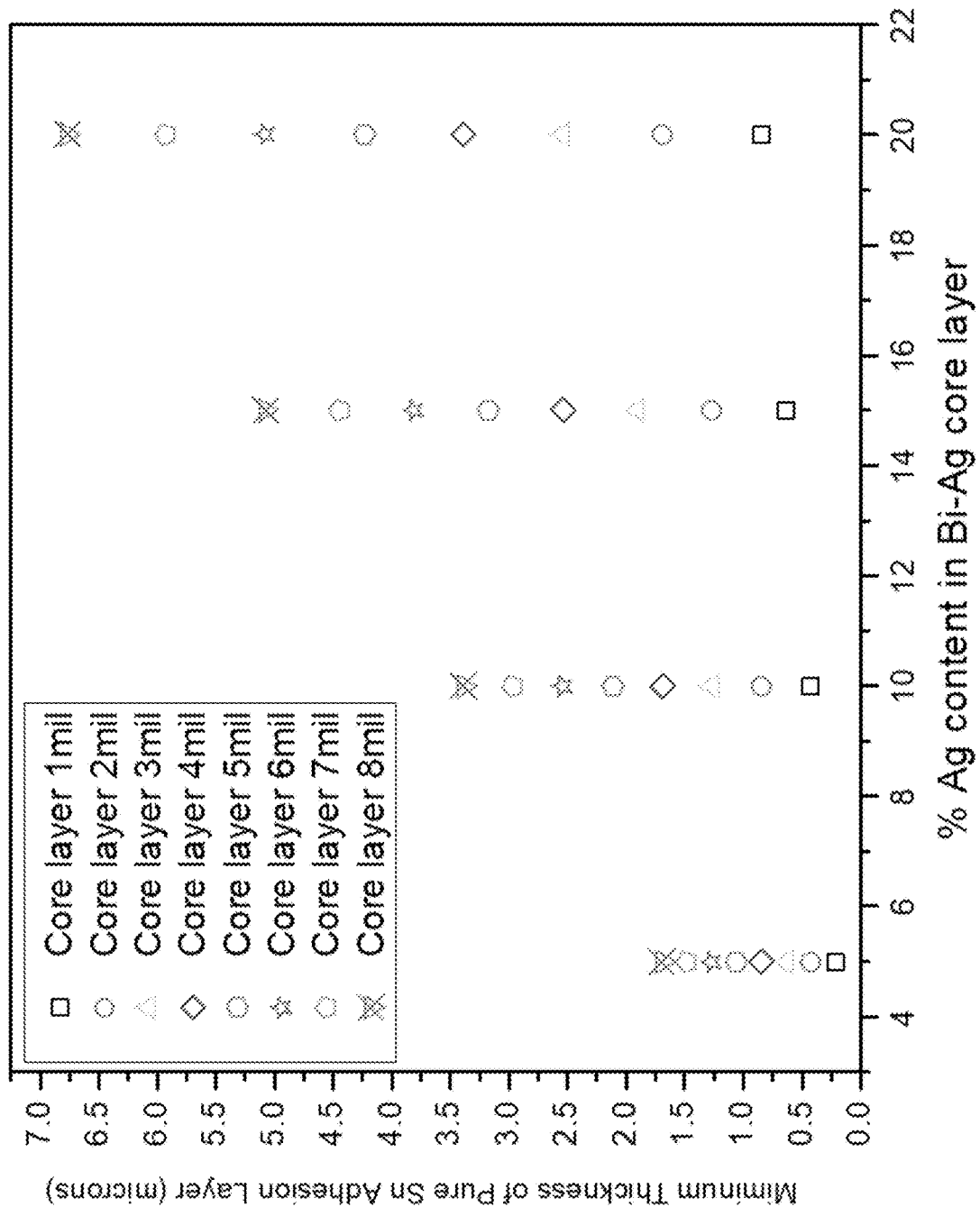
FIG. 9 is a chart illustrating the relationship of the minimum thickness (in microns) relative to % Ag content in a Bi—Ag core layer and the thickness of the core layer (in mils).

In one example design utilizing Bi—Ag as the core layer, and pure Sn as the adhesion layer, a mathematical model was developed to correlate the dependence of the minimum adhesion layer thickness "t" of pure Sn on the core layer thickness "a" and the Ag content "y" in the Bi—Ag core layer. Table 1, below, illustrates an example dependence of "t" on "a" and "y," derived using this model. FIG. 9 is a chart illustrating the relationship of the minimum thickness (in microns) relative to % Ag content in a Bi—Ag core layer and the thickness of the core layer (in mils). In this example, the minimum thickness of the adhesion layer is calculated on basis of the design that there is no more low melting Bi—Sn phase left right after reflow regardless of any interfacial reaction. Taking into consideration the interfacial reaction between Sn in the Bi—Sn adhesion layer with the surface finish of the package, in which Sn is consumed to form the interfacial IMCs, the adhesion layer thickness may be increased without leaving the low melting phase after reflow. The exact adhesion layer thickness may be calculated on the basis of the composition of both the core layer and the adhesion layer alloys, the core layer thickness, and the surface finish of the joining packages. Also, the design of the hybrid preform may take into consideration the interfacial reaction, which includes the reflow temperature, the time and the surface finish metallization.

TABLE 1

The dependence of pure Sn adhesion layer thickness "t" on the Bi—Ag core layer thickness "a" and the % Ag content in Bi—Ag core layer "y."

| a (mil) Thickness of core layer | y (%) Ag % in Bi—Ag core layer | t (mil) Minimum thickness of adhesion layer | t (micron) Minimum thickness of adhesion layer |
|---|---|---|---|
| 1 | 20 | 0.033 | 0.85 |
| 1 | 15 | 0.025 | 0.64 |
| 1 | 10 | 0.017 | 0.42 |
| 1 | 5 | 0.008 | 0.21 |
| 2 | 20 | 0.067 | 1.69 |
| 2 | 15 | 0.050 | 1.27 |
| 2 | 10 | 0.033 | 0.85 |
| 2 | 5 | 0.017 | 0.42 |
| 3 | 20 | 0.100 | 2.54 |
| 3 | 15 | 0.075 | 1.91 |
| 3 | 10 | 0.050 | 1.27 |
| 3 | 5 | 0.025 | 0.64 |
| 4 | 20 | 0.133 | 3.39 |
| 4 | 15 | 0.100 | 2.54 |
| 4 | 10 | 0.067 | 1.69 |
| 4 | 5 | 0.033 | 0.85 |
| 5 | 20 | 0.167 | 4.23 |
| 5 | 15 | 0.125 | 3.18 |
| 5 | 10 | 0.083 | 2.12 |
| 5 | 5 | 0.042 | 1.06 |
| 6 | 20 | 0.200 | 5.08 |
| 6 | 15 | 0.150 | 3.81 |
| 6 | 10 | 0.100 | 2.54 |
| 6 | 5 | 0.050 | 1.27 |
| 7 | 20 | 0.233 | 5.93 |
| 7 | 15 | 0.175 | 4.45 |
| 7 | 10 | 0.117 | 2.96 |
| 7 | 5 | 0.058 | 1.48 |
| 8 | 20 | 0.267 | 6.77 |
| 8 | 15 | 0.200 | 5.08 |
| 8 | 10 | 0.133 | 3.39 |
| 8 | 5 | 0.067 | 1.69 |

Figure 10:
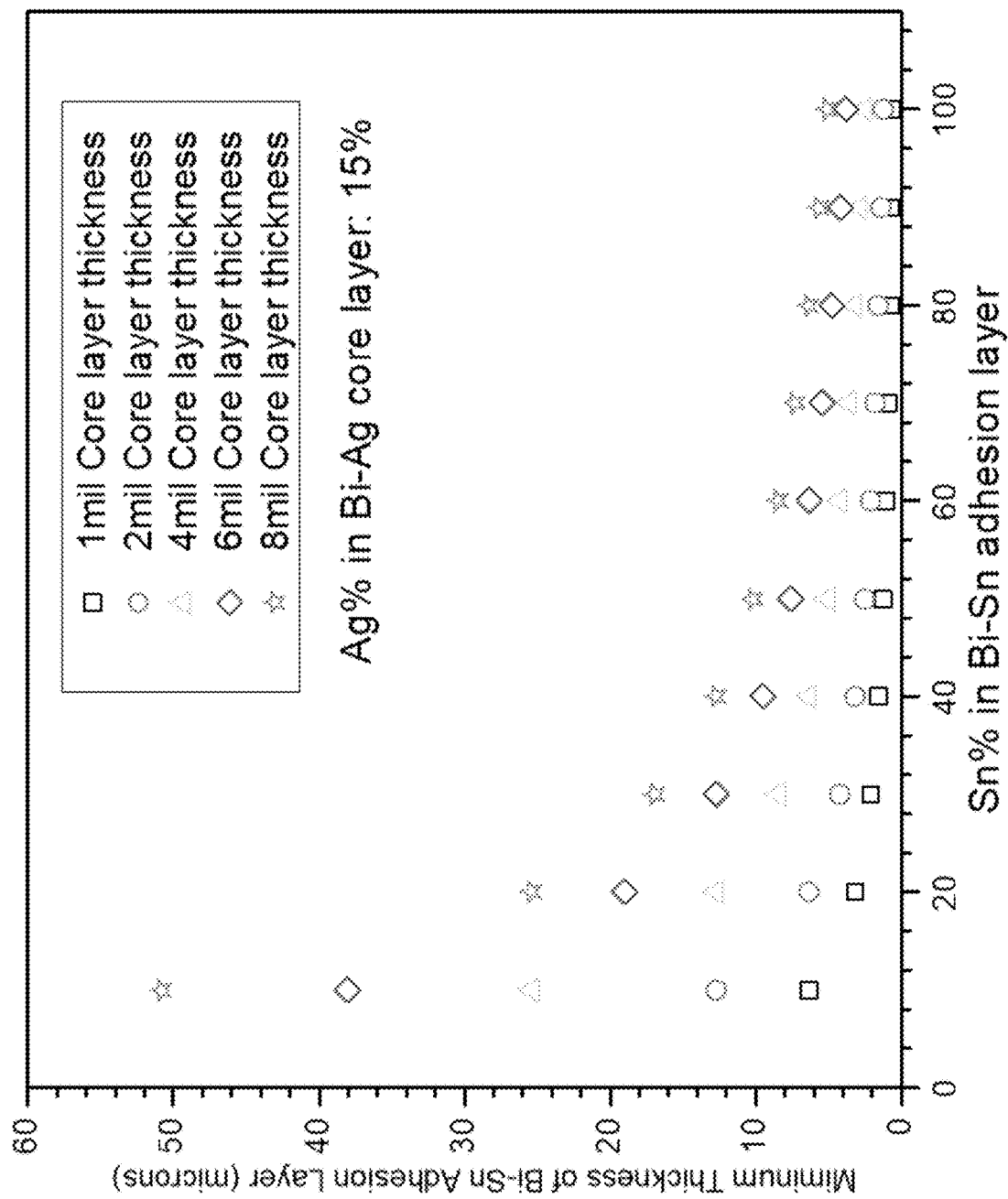
FIG. 10 is a chart showing the relationship of the minimum thickness (in microns) of the Bi—Sn or Sn adhesion layer relative to the core layer thickness (in mils), and the composition of both the core layer and the adhesion layer.

In another example design, utilizing Bi-15Ag as the core layer, and Bi—Sn alloys as the adhesion layer, a mathematical model was developed to find the dependence of the Bi-xSn adhesion layer thickness "t" on the core layer thickness "a" and Sn % in the Bi—Sn (or Sn for 100%) adhesion layer "x." Table 2 illustrates example dependencies derived using this model. FIG. 10 is a chart showing the relationship of the minimum thickness (in microns) of the Bi—Sn or Sn adhesion layer relative to the core layer thickness (in mils), and the composition of both the core layer and the adhesion layer.

TABLE 2 dependence of adhesion layer thickness "t" on the Bi—Ag core layer thickness "a" and the Sn content in Bi—Sn adhesion layer "x"

| a (mil) Thickness of core layer | y (%) Ag% in Bi—Ag core layer | X (%) Sn% on Bi—Sn adhesion layer | t (mil) Minimum thickness of adhesion layer | t (micron) Minimum thickness of adhesion layer |
|---|---|---|---|---|
| 1 | 15 | 100 | 0.025 | 0.64 |
| 1 | 15 | 90 | 0.028 | 0.71 |
| 1 | 15 | 80 | 0.031 | 0.79 |
| 1 | 15 | 70 | 0.036 | 0.91 |
| 1 | 15 | 60 | 0.042 | 1.06 |
| 1 | 15 | 50 | 0.050 | 1.27 |
| 1 | 15 | 40 | 0.063 | 1.59 |
| 1 | 15 | 30 | 0.083 | 2.12 |
| 1 | 15 | 20 | 0.125 | 3.18 |
| 1 | 15 | 10 | 0.250 | 6.35 |
| 2 | 15 | 100 | 0.050 | 1.27 |
| 2 | 15 | 90 | 0.056 | 1.41 |
| 2 | 15 | 80 | 0.063 | 1.59 |
| 2 | 15 | 70 | 0.071 | 1.81 |
| 2 | 15 | 60 | 0.083 | 2.12 |
| 2 | 15 | 50 | 0.100 | 2.54 |
| 2 | 15 | 40 | 0.125 | 3.18 |
| 2 | 15 | 30 | 0.167 | 4.23 |
| 2 | 15 | 20 | 0.250 | 6.35 |
| 2 | 15 | 10 | 0.500 | 12.70 |
| 4 | 15 | 100 | 0.100 | 2.54 |
| 4 | 15 | 90 | 0.111 | 2.82 |
| 4 | 15 | 80 | 0.125 | 3.18 |
| 4 | 15 | 70 | 0.143 | 3.63 |
| 4 | 15 | 60 | 0.167 | 4.23 |
| 4 | 15 | 50 | 0.200 | 5.08 |
| 4 | 15 | 40 | 0.250 | 6.35 |
| 4 | 15 | 30 | 0.333 | 8.47 |
| 4 | 15 | 20 | 0.500 | 12.70 |
| 4 | 15 | 10 | 1.000 | 25.40 |
| 6 | 15 | 100 | 0.150 | 3.81 |
| 6 | 15 | 90 | 0.167 | 4.23 |
| 6 | 15 | 80 | 0.188 | 4.76 |
| 6 | 15 | 70 | 0.214 | 5.44 |
| 6 | 15 | 60 | 0.250 | 6.35 |
| 6 | 15 | 50 | 0.300 | 7.62 |
| 6 | 15 | 40 | 0.375 | 9.53 |
| 6 | 15 | 30 | 0.500 | 12.70 |
| 6 | 15 | 20 | 0.750 | 19.05 |
| 6 | 15 | 10 | 1.500 | 38.10 |
| 8 | 15 | 100 | 0.200 | 5.08 |

TABLE 2-continued dependence of adhesion layer thickness "t" on the Bi—Ag core layer thickness "a" and the Sn content in Bi—Sn adhesion layer "x"

| a (mil) Thickness of core layer | y (%) Ag% in Bi—Ag core layer | X (%) Sn% on Bi—Sn adhesion layer | t (mil) Minimum thickness of adhesion layer | t (micron) Minimum thickness of adhesion layer |
|---|---|---|---|---|
| 8 | 15 | 90 | 0.222 | 5.64 |
| 8 | 15 | 80 | 0.250 | 6.35 |
| 8 | 15 | 70 | 0.286 | 7.26 |
| 8 | 15 | 60 | 0.333 | 8.47 |
| 8 | 15 | 50 | 0.400 | 10.16 |
| 8 | 15 | 40 | 0.500 | 12.70 |
| 8 | 15 | 30 | 0.667 | 16.93 |
| 8 | 15 | 20 | 1.000 | 25.40 |
| 8 | 15 | 10 | 2.000 | 50.80 |

Figure 3:
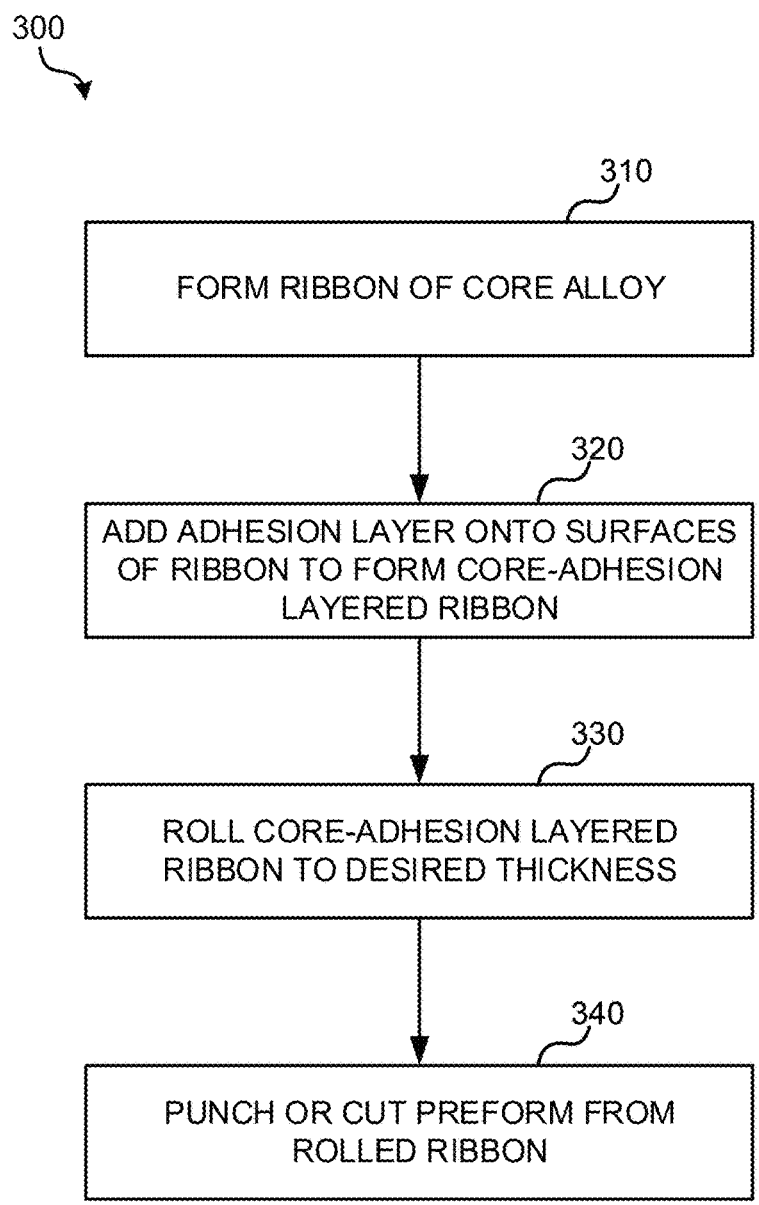
FIG. 3 is an operational flow diagram illustrating an example method of forming a solder preform in accordance with implementations described herein.

FIG. 3 is an operational flow diagram illustrating an example method of forming a preform in accordance with implementations described herein. For simplicity, some process operations (e.g., cleaning/rinsing/drying during or after preform formation) may be omitted from this description.

At operation 310, a ribbon of a core layer's alloy may be formed. For example, a Bi-rich solder alloy such as BiAg may be cast, extruded, and rolled into a ribbon. At operation 320, an adhesion layer including a second metal or solder alloy is added onto surfaces of the core ribbon to form a core-adhesion layered ribbon.

Figure 4A:
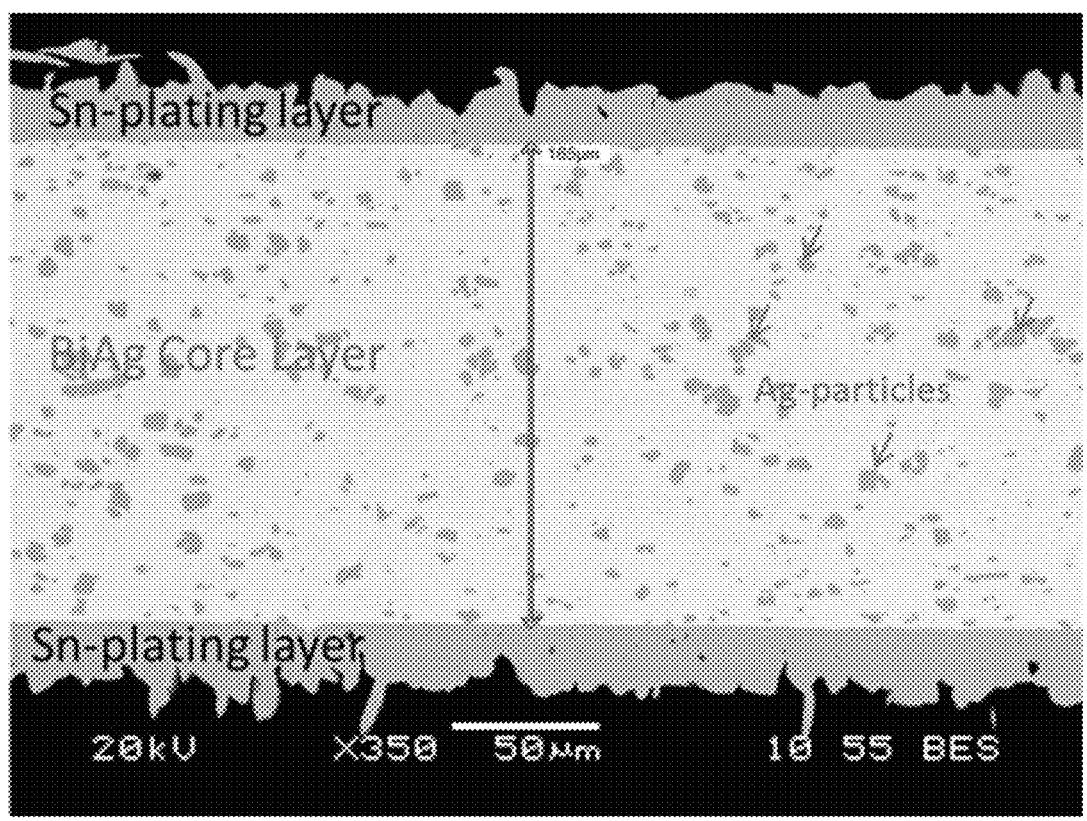
FIG. 4A is an electron micrograph illustrating a cross-section of an example core-adhesion layered ribbon after electroplating pure Sn onto a surface of a Bi-11Ag core ribbon, in accordance with implementations.
Figure 4B:
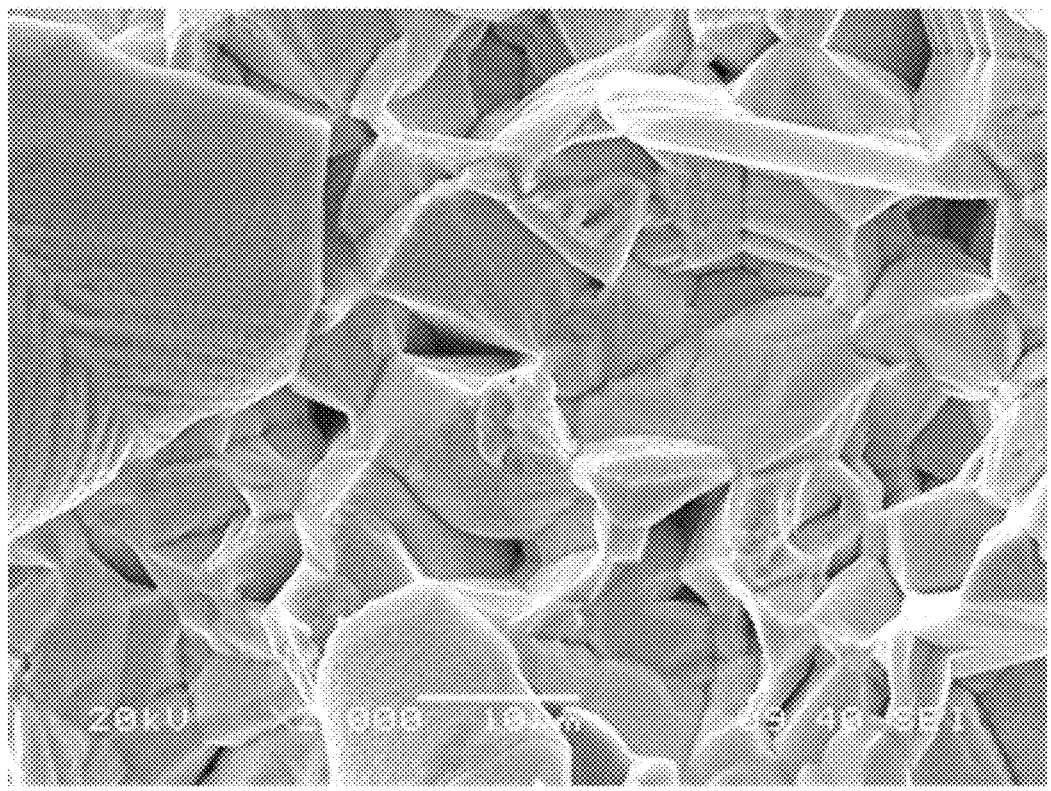
FIG. 4B is an electron micrograph illustrating the grain morphology of the Sn plating layer of FIG. 4A.

In one implementation, the adhesion layer may be added by electroplating the surface of a core ribbon (e.g., a BiAg core ribbon) with an adhesion material (e.g., a material made of an Sn metal or Bi—Sn alloy). FIGS. 4A-4B are electron micrographs illustrating one example of a core-adhesion layered ribbon after electroplating pure Sn onto a surface of a Bi-11Ag core ribbon. FIG. 4A is a micrograph illustrating a cross-section of the ribbon after plating. FIG. 4B is a micrograph illustrating the grain morphology of the Sn plating layer. In this example, the plating layer thickness is around 28 microns on each side of a 168 micron thick core layer. Depending on the processing conditions, the average thickness of the plating layer may vary from about 5 to 30 microns.

Figure 5A:
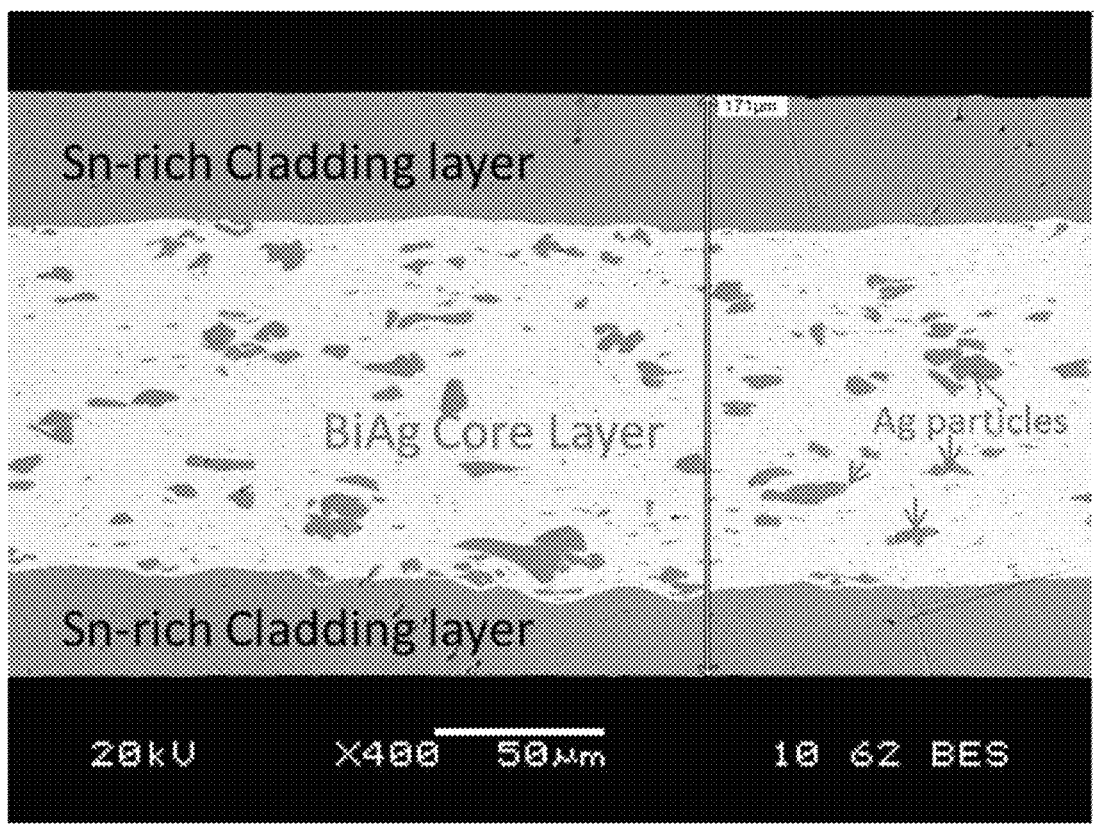
FIG. 5A is an electron micrograph illustrating a cross-section of an example core-adhesion layered ribbon after cladding Sn-rich alloy foils on both sides of a BiAg core ribbon, in accordance with implementations.
Figure 5B:
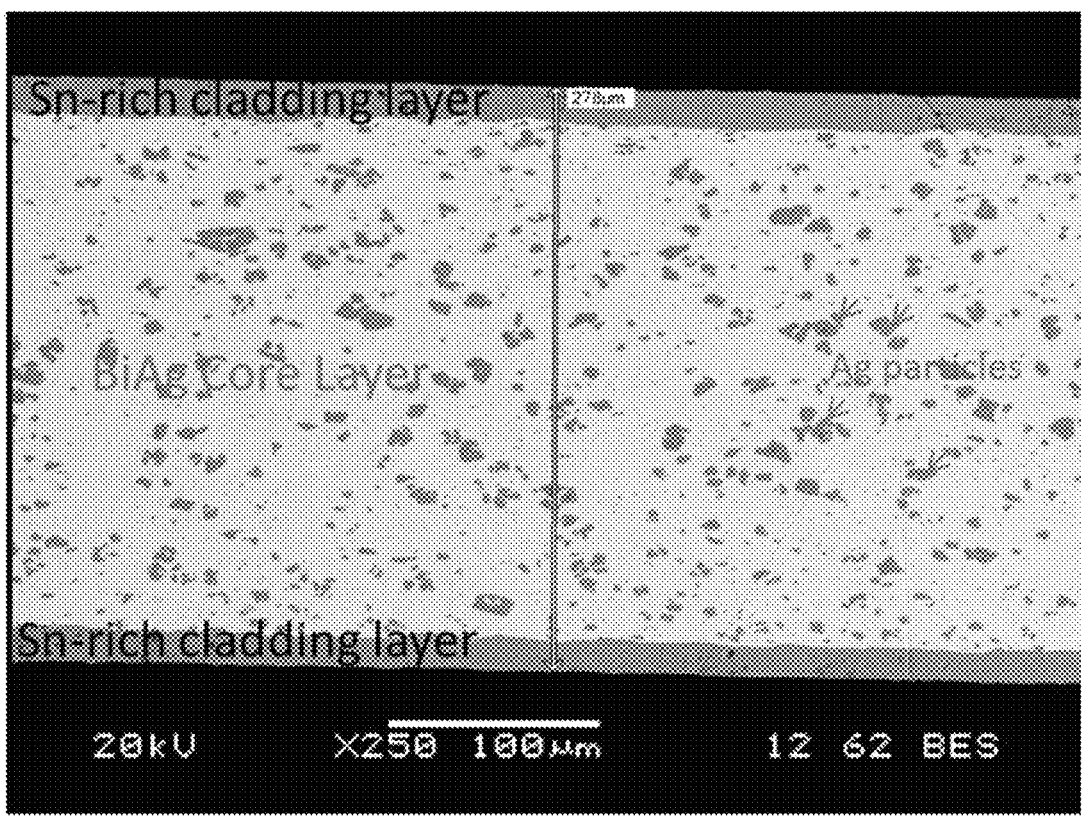
FIG. 5B is an electron micrograph illustrating a cross-section of another example core-adhesion layered ribbon after cladding Sn-rich alloy foils on both sides of a BiAg core ribbon, in accordance with implementations.

In another implementation, the adhesion layer may be added by cladding an adhesion material foil (e.g., a foil made of a Sn metal or Bi—Sn alloy) onto both sides of a core ribbon (e.g., a BiAg core ribbon). During cladding, the core ribbon may be placed between two adhesion foils, and the assembly rolled to join the layers together and form a core-adhesion ribbon. FIGS. 5A-5B are electron micrographs illustrating two examples of cross-sections of a core-adhesion layered ribbon after cladding Sn-rich alloy foils on both sides of a BiAg core ribbon. In the example of FIG. 5A, the core-adhesion layered ribbon is about 7 mils thick and has adhesions layers that are each about 1.2 mils thick. In the example of FIG. 5B, the core-adhesion layered ribbon is about 11 mils thick and has adhesions layers that are each about 1 mils thick. In various implementations, the cladding layer thickness and the core layer thickness may be controlled by: (i) employing different thicknesses of a core ribbon and/or adhesion foil; and/or (ii) controlling the thickness reduction rate during rolling. One advantage of the cladding process is that the surface roughness of the adhesion layer may be minimized.

In another implementation, the adhesion layer may be formed by dipping the core ribbon (e.g., a BiAg core ribbon) in a molten adhesion alloy bath (e.g., a bath of a molten Sn alloy), and allowing the assembly to cool such that the adhesion alloy adheres on both sides of the core ribbon. In yet further implementations, other methods may be used to form adhesion layers over a core ribbon.

Figure 6A:
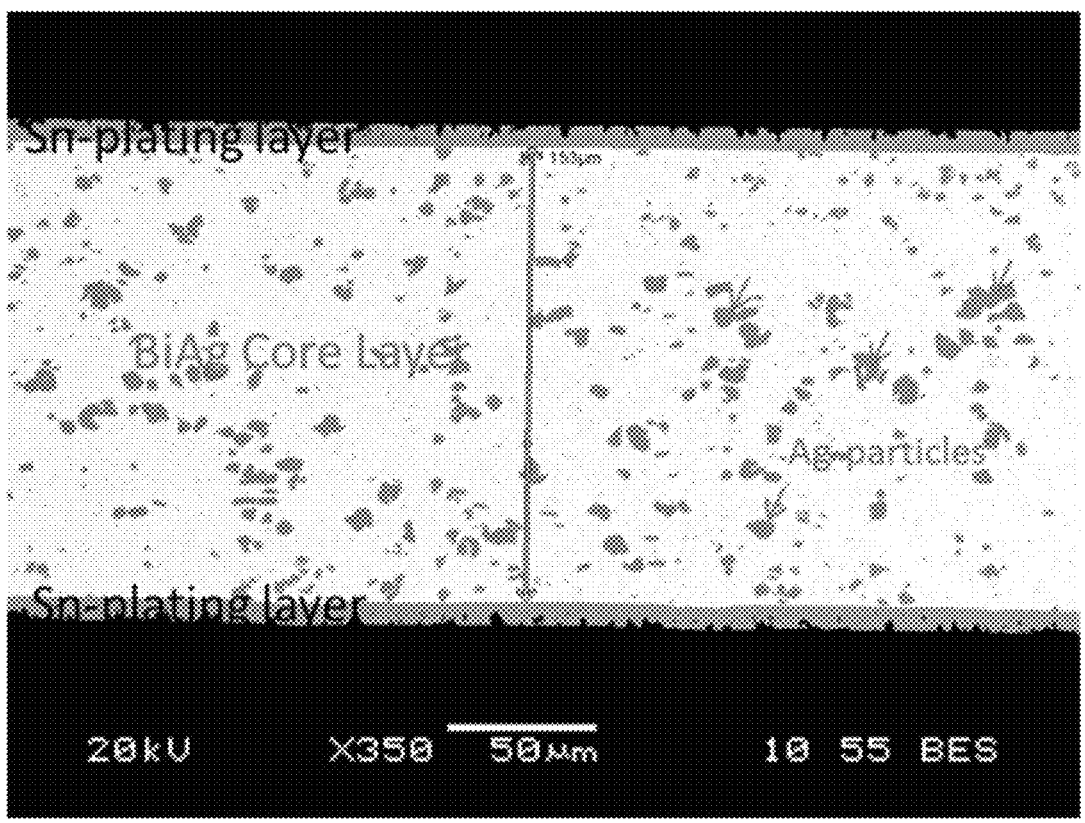
FIG. 6A is an electron micrograph illustrating a cross section of the core-adhesion layered ribbon of FIG. 4A after rolling the ribbon.
Figure 6B:
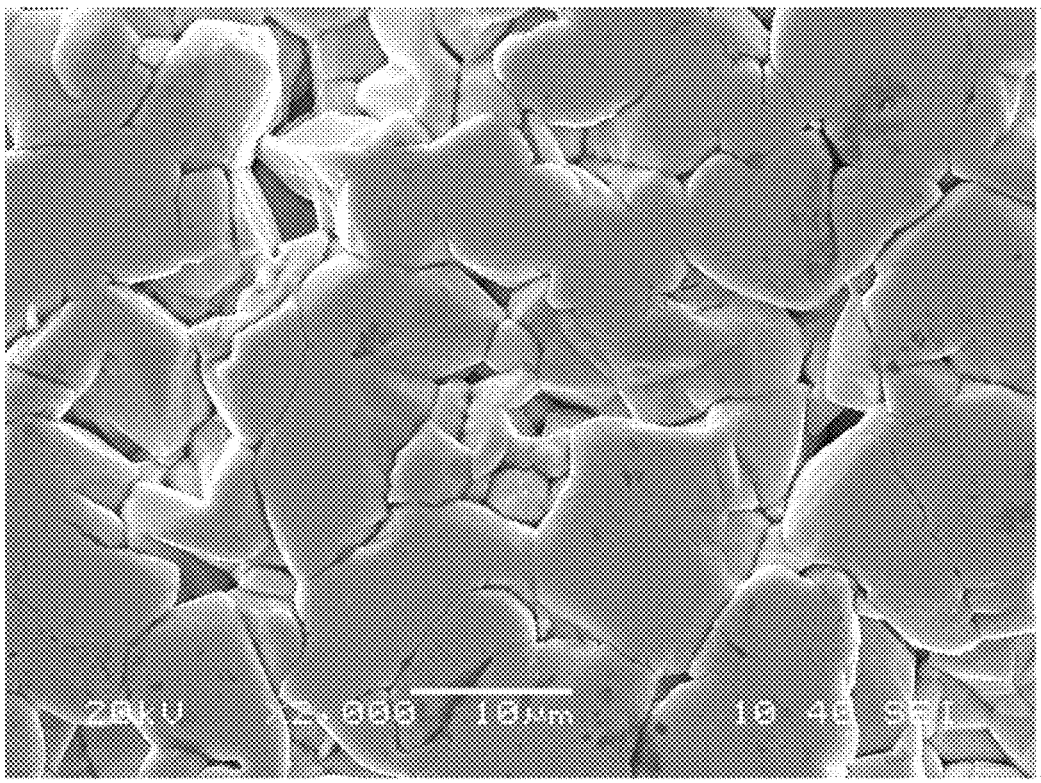
FIG. 6B is an electron micrograph illustrating the grain morphology of the Sn plating layer of FIG. 6A.

At operation 330, the formed core-adhesion layered ribbon may be rolled to thin the ribbon to a desired thickness and/or smoothen the surface of the ribbon (i.e., the adhesion layer). In some implementations, this operation may be skipped. FIGS. 6A-6B are electron micrographs illustrating the plated ribbon of FIGS. 4A-4B after rolling the plated ribbon. As illustrated, the thicknesses of the BiAg core layer and the Sn coating layer have been thinned, and the Sn coating layer has been smoothened. FIG. 6A is a micrograph illustrating a cross-section of the ribbon after plating and rolling. FIG. 6B illustrates the flattened grains of the Sn coating layer after rolling.

At operation 340, one or more preforms may be punch or cut from the rolled core-adhesion layered ribbon. For example, plate shaped preforms, frame shaped preforms, or some other shape of preforms may be punch or cut from the ribbon.

Figure 7A:
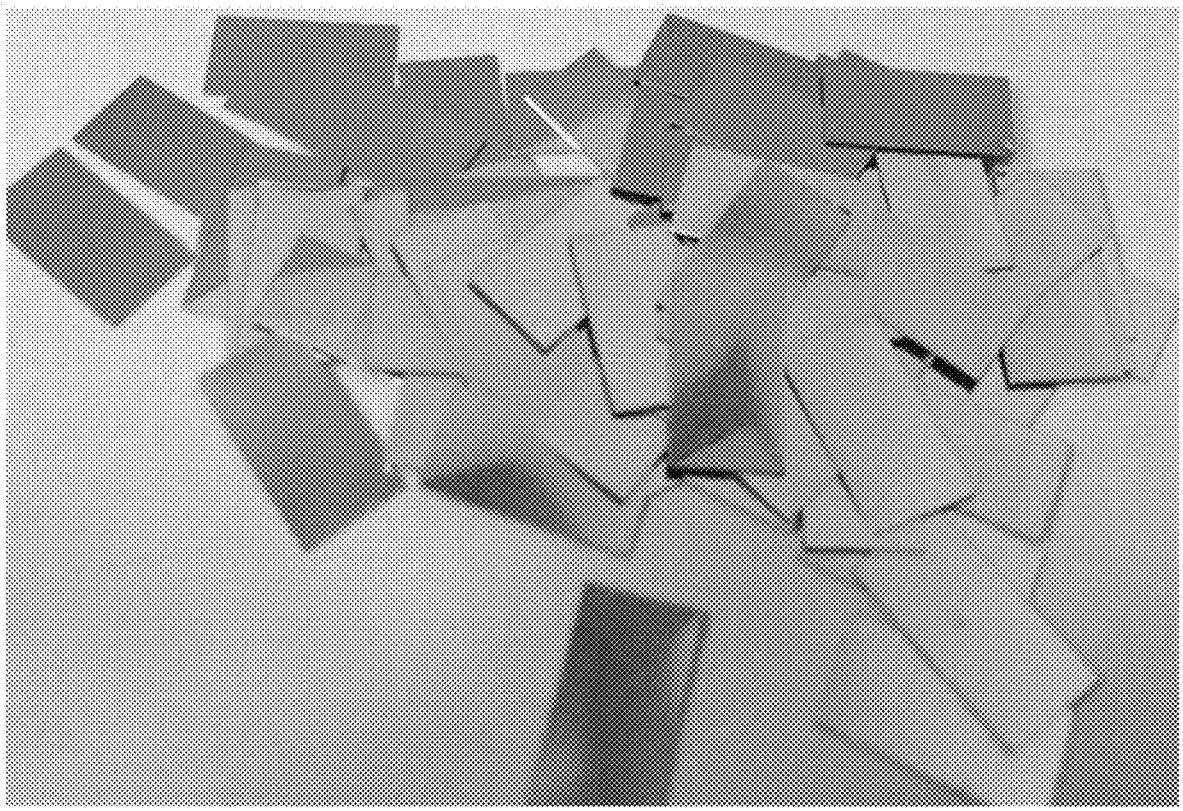
FIG. 7A illustrates rectangular shaped core-adhesion structured preforms punched from a ribbon, in accordance with implementations.
Figure 7B:
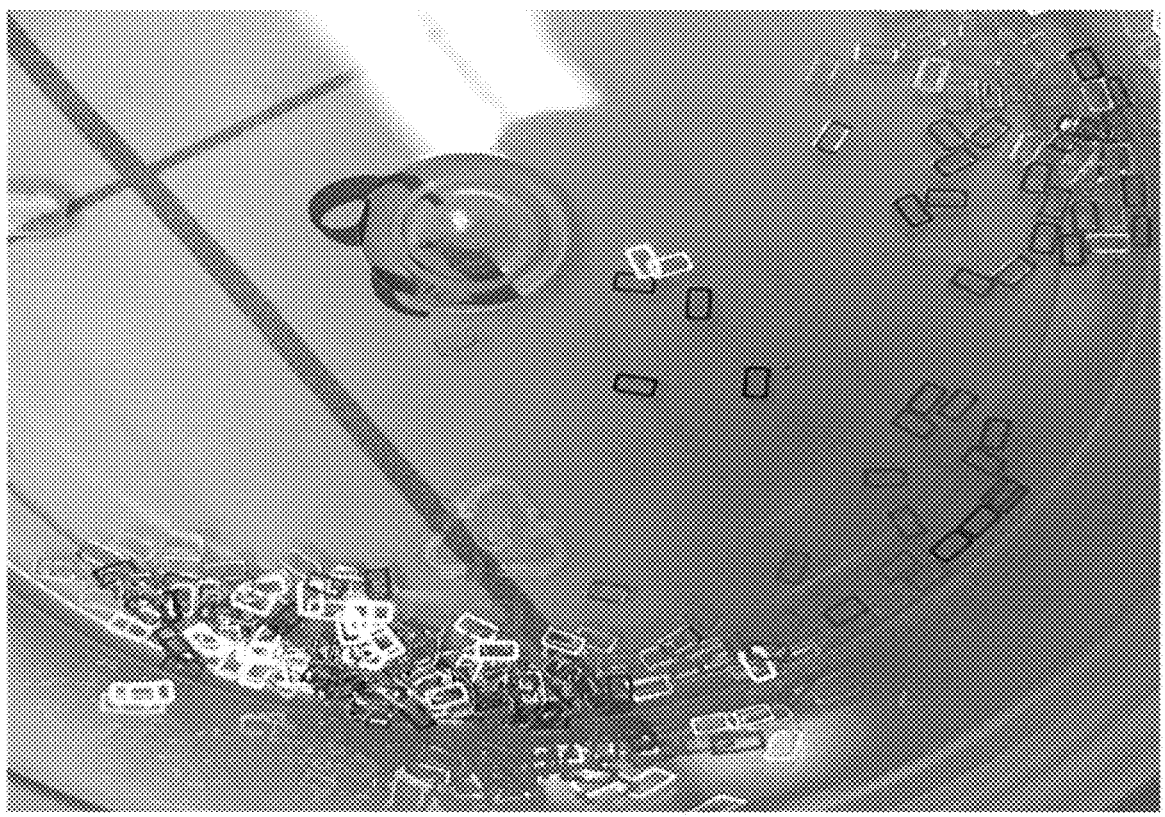
FIG. 7B illustrates frame shaped core-adhesion structured preforms punched from a ribbon, in accordance with implementations.

FIG. 7A illustrates rectangular shaped core-adhesion structured preforms punched from a ribbon. FIG. 7B illustrates frame shaped core-adhesion structured preforms punched from a ribbon.

Figure 8A:
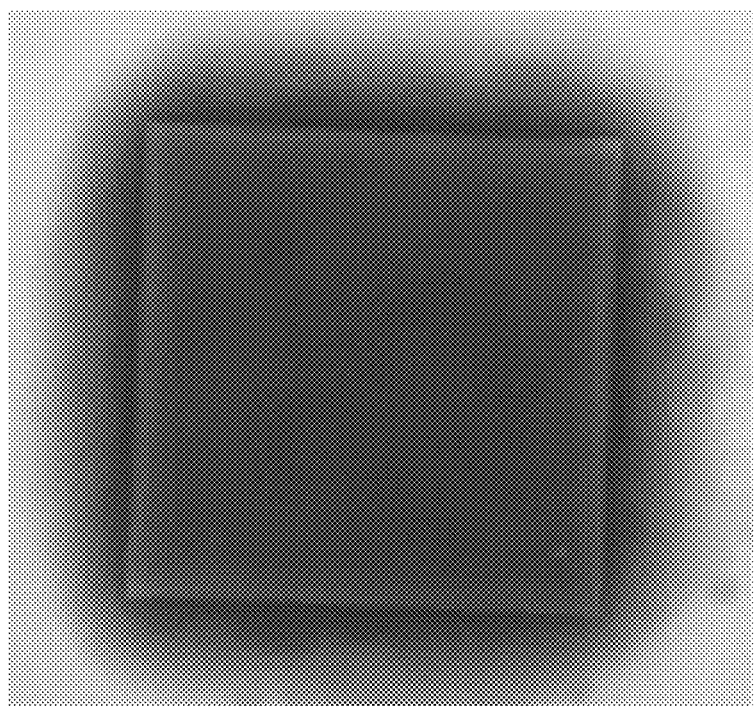
FIG. 8A is an X-ray image illustrating a Si-die/Cu substrate assembly including a solder joint between the Si die and Cu substrate, where the solder joint was formed from a solder preform in accordance with implementations.
Figure 8B:
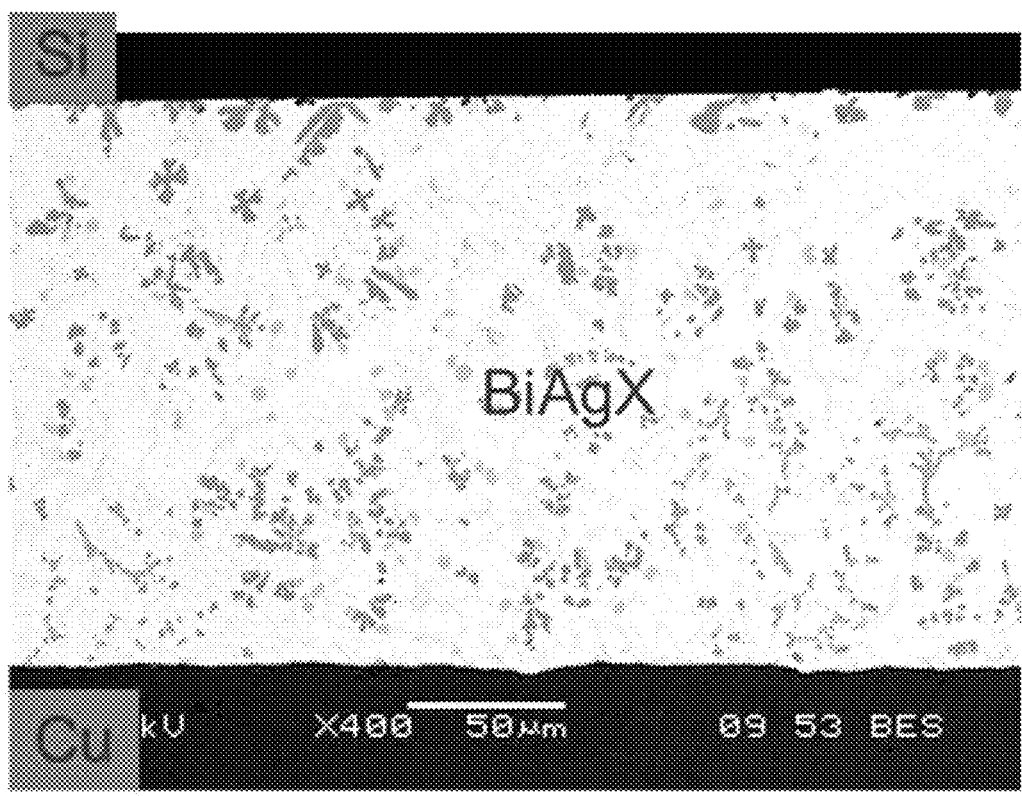
FIG. 8B is an electron micrograph illustrating a cross-section of the microstructure of the solder joint of the assembly of FIG. 8A.

Implementations of the core-adhesion structured performs described herein were tested in a die attach package. FIG. 8A is an X-ray image illustrating a Si-die/Cu substrate assembly including a solder joint between a Si die and Cu substrate, where the solder joint was formed from a solder preform in accordance with the disclosure. FIG. 8B is a micrograph illustrating a cross-section of the microstructure of the solder joint of the assembly of FIG. 8A. In this example, the solder preform comprised Bi—Ag as the core layer and Sn as the adhesion layer. As illustrated by FIGS. 8A-8B, there are near-zero voids in the package, and the microstructure of the resulting joint between the Si die and Cu substrate is good and no low melting Bi—Sn phase being detected.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A solder preform, consisting essentially of:
    a central core layer consisting of a Bi alloy having a solidus temperature above 260° C.; and
    an adhesion layer coated over the central core layer, the adhesion layer consisting of a second solder alloy or metal having a solidus temperature below 245° C., wherein the second solder alloy or metal is Sn, a Sn alloy, a Bi alloy, In, or an In alloy,
    wherein the central core layer has a thickness between 1 and 8 mils, the adhesion layer has a thickness between 0.1 and 52 microns, and the thickness of the adhesion layer relative to the thickness of the core layer is configured such that there are no phases having a melting temperature below 260° C. left inside a solder joint formed by reflow soldering the solder preform at a temperature above 260° C.

2. The solder preform of claim 1, wherein the second solder alloy or metal is Sn or a Sn alloy.

3. The solder preform of claim 2 wherein the adhesion layer consists of Sn.

4. The solder preform of claim 2, wherein the second solder alloy or metal is a Sn—Ag alloy, a Sn—Cu alloy, a Sn—Ag—Cu alloy, a Sn—Ag—Cu—X (X=Al, Au, Bi, Co, Ga, Ge, In, Mn, Ni, P, Pd, Pt, Sb, or Zn) alloy, a Sn—Zn alloy, a Sn—In alloy or a Sn—In—X (X=Ag, Al, Au, Bi, Co, Cu, Ga, Ge, Mn, Ni, P, Pd, Pt, Sb, or Zn) alloy.

5. The solder preform of claim 4, wherein the second solder alloy is a Sn—Ag alloy, a Sn—Cu alloy, a Sn—Ag—Cu alloy, or a Sn—Ag—Cu—X (X=Al, Au, Bi, Co, Ga, Ge, In, Mn, Ni, P, Pd, Pt, Sb, or Zn) alloy.

6. The solder preform of claim 5, wherein the second solder alloy comprises from greater than 0 to 10 wt % Ag, with the remainder being Sn, or from greater than 0 to 5 wt % Cu, with the remainder being Sn, or from greater than 0 to 10 wt % Ag and from greater than 0 to 5 wt % Cu, with the remainder being Sn, or from greater than 0 to 10 wt % Ag, from greater than 0 to 5 wt % Cu, and from greater than 0 to 5 wt % X, with the remainder being Sn.

7. The solder preform of claim 6, wherein the second solder alloy comprises from greater than 0 to 5 wt % Ag, with the remainder being Sn, or from greater than 0 to 2 wt % Cu, with the remainder being Sn, or from greater than 0 to 5 wt % Ag and from greater than 0 to 2 wt % Cu, with the remainder being Sn, or from greater than 0 to 5 wt % Ag and from greater than 0 to 2 wt % Cu and from greater than 0 to 2 wt % X, with the remainder being Sn.

8. The solder preform of claim 4, wherein the second solder alloy is a Sn—In alloy or a Sn—In—X (X=Ag, Al, Au, Bi, Co, Cu, Ga, Ge, Mn, Ni, P, Pd, Pt, Sb, or Zn) alloy.

9. The solder preform of claim 8, wherein the second solder alloy comprises from greater than 0 to 50 wt % In, with remainder being Sn, or from greater than 0 to 50 wt % In and greater than 0 to 30 wt % X, with the remainder being Sn.

10. The solder preform of claim 1, wherein the second solder alloy is a Bi alloy.

11. The solder preform of claim 10, wherein the second solder alloy is a Bi—Sn alloy or a Bi—Sn—X (X=Ag, Al, Au, Co, Cu, Ga, Ge, In, Mn, Ni, P, Pd, Pt, Sb, or Zn) alloy.

12. The solder preform of claim 11, wherein the second solder alloy comprises from 2 to 60 wt % Sn, with the remainder being Bi, or from 2 to 50 wt % Sn and from greater than 0 to 30 wt % X, with the remainder being Bi.

13. The solder preform of claim 10, wherein the second solder alloy is a Bi—In alloy or Bi—In—X (X=Ag, Al, Au, Co, Cu, Ga, Ge, Mn, Ni, P, Pd, Pt, Sb, or Zn) alloy.

14. The solder preform of claim 13, wherein the second solder alloy comprises from greater than 0 to 50 wt % In, with the remainder being Bi, or from greater than 0 to 50 wt % In and from greater than 0 to 30 wt % X, with the remainder being Bi.

15. The solder preform of claim 1, wherein the central core layer consists of a Bi—Ag alloy, a Bi—Cu alloy, a Bi—Ag—Cu alloy, or a Bi—Sb alloy.

16. The solder preform of claim 15, wherein the central core layer consists of the Bi—Ag alloy, wherein the Bi—Ag alloy comprises from greater than 0 to 30 wt % Ag, with the remainder being Bi, or from greater than 0 to 20 wt % Ag and from greater than 0 to 5 wt % X (X=Al, Au, Co, Ga, Ge, In, Mn, Ni, P, Pd, Pt, Sb, Sn, or Zn), with the remainder being Bi.

17. The solder preform of claim 15, wherein the central core layer consists of the Bi—Cu alloy, wherein the Bi—Cu alloy comprises from greater than 0 to 5 wt % Cu, with the remainder being Bi, or from greater than 0 to 5 wt % Cu and from greater than 0 to 5 wt % X (X=Al, Au, Co, Ga, Ge, In, Mn, Ni, P, Pd, Pt, Sb, Sn, or Zn), with the remainder being Bi.

18. The solder preform of claim 15, wherein the central core layer consists of the Bi—Ag—Cu alloy, wherein the Bi—Ag—Cu alloy comprises from greater than 0 to 20 wt % Ag and from greater than 0 to 5 wt % Cu, with the remainder being Bi, or from greater than 0 to 20 wt % Ag and from greater than 0 to 5 wt % Cu and from greater than 0 to 5 wt % X (X=Al, Au, Co, Ga, Ge, In, Mn, Ni, P, Pd, Pt, Sb, Sn, or Zn), with the remainder being Bi.

19. The solder preform of claim 15, wherein the central core layer consists of the alloy, wherein the Bi—Sb alloy comprises from greater than 0 to 20 wt % Sb, with the remainder being Bi, or from greater than 0 to 20 wt % Sb and from greater than 0 to 10 wt % X (X=Ag, Al, Au, Co, Cu, Ga, Ge, In, Mn, Ni, P, Pd, Pt, Sb, Sn, or Zn), with the remainder being Bi.

\* \* \* \* \*